United States Patent
Ninagawa et al.

(10) Patent No.: US 7,437,269 B2
(45) Date of Patent: Oct. 14, 2008

(54) METHOD, SYSTEM AND PROGRAM FOR EVALUATING RELIABILITY ON COMPONENT

(75) Inventors: Noriyasu Ninagawa, Fujisawa (JP); Noriaki Yamamoto, Zushi (JP); Yuzo Hiroshige, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 54 days.

(21) Appl. No.: 11/392,693

(22) Filed: Mar. 30, 2006

(65) Prior Publication Data

US 2006/0220660 A1    Oct. 5, 2006

(30) Foreign Application Priority Data

Mar. 30, 2005    (JP) .............................. 2005-096694

(51) Int. Cl.
  *G06F 11/30* (2006.01)
  *G06F 19/00* (2006.01)
  *G21C 17/00* (2006.01)

(52) U.S. Cl. ........................................ 702/182; 702/81

(58) Field of Classification Search .................... 702/81, 702/84, 179–182

See application file for complete search history.

(56) References Cited

FOREIGN PATENT DOCUMENTS

| | | |
|---|---|---|
| JP | 11-238069 | 8/1999 |
| JP | 2002-049649 | 2/2002 |
| JP | 2003-203105 | 7/2003 |
| JP | 2003-256504 | 9/2003 |
| JP | 2004-038656 | 2/2004 |
| JP | 2005-071338 | 3/2005 |
| JP | 2005-309674 | 11/2005 |
| JP | 2006-099308 | * 4/2006 |

* cited by examiner

*Primary Examiner*—Michael P Nghiem
(74) *Attorney, Agent, or Firm*—Antonelli, Terry, Stout & Kraus, LLP.

(57) ABSTRACT

The present invention provides a system which is capable of supporting a designer in confirming constituent information of a component at early stages of design. The system has a functional configuration, in which constituents contained in a target component and a content of each of the constituents are calculated referring to a constituent information table based on identification information of the target component. Conformity of the constituent to environmental regulations is evaluated based on the content. A component similar to the target component is extracted referring to an environmental qualification information table to calculate constituents contained in the similar component and a content of each of the constituents; and credibility of evaluation of the conformity to environmental regulations is evaluated based on a difference between the content of the constituent in the target component and the content of the constituent in the similar component.

4 Claims, 14 Drawing Sheets

FIG. 2

SEARCH OPTION SETTING

SEARCH KEY

| | SUPPLIER KEY ITEM | | DESIGNER KEY ITEM | |
|---|---|---|---|---|
| ☐ | SUPPLIER NAME | SUPPLIER 00 CO., LTD | ☑ PART NUMBER | 10000000 |
| ☑ | MANUFACTURER NAME | RESISTOR MANUFACTURER | ☑ SPECIFICATION VALUE | 100 |
| ☑ | ITEM CODE | TEST-99* | SPECIFICATION VALUE UNIT | Ω |
| ☐ | ITEM KEYWORD | SQUARE CHIP RESISTOR | ☑ COMPONENT CODE | 100 |

FUZZY SEARCH OPTION

☑ COMPARE WITH UPPER 0s OF PART NUMBER IGNORED
☑ COMPARE WITH SPACES IGNORED
☑ CASE-INSENSITIVE COMPARISON
☑ COMPARE AFTER CONVERTING TWO-BYTE CODE SYMBOL INTO ONE BYTE
☑ COMPARE AFTER CONVERTING ONE-BYTE KATAKANA CHARACTERS INTO TWO-BYTE KATAKANA CHARACTERS
☑ COMPARE WITH HYPHENS IGNORED
☑ COMPARE WITH SPECIFIC CHARACTER AS WILDCARD CHARACTER

WILDCARD CHARACTER [*]

[RETURN] [NEXT] [CANCEL]

FIG. 3

SEARCH RESULT

SEVEN RESULTS FOUND IN SEARCH. CLICK MANUFACTURER MODEL NUMBER OF TARGET COMPONENT.

SEARCH RESULT

| ITEM CODE | ITEM NAME | SUPPLIER CODE | SUPPLIER NAME | MANUFACTURER CODE | MANUFACTURER | ENVIRONMENTAL QUALIFICATION |
|---|---|---|---|---|---|---|
| TEST-99A ▶ | SQUARE CHIP RESIS ▶ | 99900 ▶ | SUPPLIER 00 CO., LTD ▶ | 99999 ▶ | RESISTOR MANUFACTUR ▶ | FAIL ▶ |
| TEST-99A | SQUARE CHIP RESISTOR | 99900 | SUPPLIER 00 CO., LTD | 99999 | RESISTOR MANUFACTURER | FAIL |
| TEST-99 4.5 | SQUARE CHIP RESISTOR | 99900 | SUPPLIER 00 CO., LTD | 99999 | RESISTOR MANUFACTURER | - |
| TEST-99 5.0 | SQUARE CHIP RESISTOR | 99900 | SUPPLIER 00 CO., LTD | 99999 | RESISTOR MANUFACTURER | - |
| TEST-99 6.0 | SQUARE CHIP RESISTOR | 99900 | SUPPLIER 00 CO., LTD | 99999 | RESISTOR MANUFACTURER | - |
| TEST-99 4.5 | SQUARE CHIP RESISTOR | 99901 | ZERO-ICHI SALES CO., LTD | 99999 | RESISTOR MANUFACTURER | PASS |
| TEST-99 5.0 | SQUARE CHIP RESISTOR | 99901 | ZERO-ICHI SALES CO., LTD | 99999 | RESISTOR MANUFACTURER | PASS |
| TEST-99 6.0 | SQUARE CHIP RESISTOR | 99901 | ZERO-ICHI SALES CO., LTD | 99999 | RESISTOR MANUFACTURER | PASS |

QUALIFIED SIMILAR COMPONENT

| ITEM CODE | ITEM NAME | SUPPLIER CODE | SUPPLIER NAME | MANUFACTURER CODE | MANUFACTURER | ECALS | ENVIRONMENTAL QUALIFICATION |
|---|---|---|---|---|---|---|---|
| ABCDEF-01 ▶ | SQUARE CHIP RESIS ▶ | 11111 ▶ | 11 INDUSTRY CO., LTD ▶ | 11111 ▶ | 11 INDUSTRY CO., LTD | XJA771 ▶ | PASS ▶ |
| ABCDEF-01 | SQUARE CHIP RESISTOR | 11111 | 11 INDUSTRY CO., LTD | 11111 | 11 INDUSTRY CO., LTD | XJA771 | PASS |
| ABCDEF-02 | SQUARE CHIP RESISTOR | 11111 | 11 INDUSTRY CO., LTD | 11111 | 11 INDUSTRY CO., LTD | XJA771 | PASS |
| ABCDEF-03 | SQUARE CHIP RESISTOR | 11111 | 11 INDUSTRY CO., LTD | 11111 | 11 INDUSTRY CO., LTD | XJA771 | PASS |
| GHIJKL-01 | SQUARE CHIP RESISTOR | 22222 | 22 INDUSTRY CO., LTD | 22222 | 22 INDUSTRY CO., LTD | XJA771 | FAIL |
| TEST-99 4.5 | SQUARE CHIP RESISTOR | 99901 | ZERO-ICHI SALES CO., LTD | 99999 | RESISTOR MANUFACTURER | XJA771 | NOT INVESTIGATED |
| TEST-99 5.0 | SQUARE CHIP RESISTOR | 99901 | ZERO-ICHI SALES CO., LTD | 99999 | RESISTOR MANUFACTURER | XJA771 | NOT INVESTIGATED |
| TEST-99 6.0 | SQUARE CHIP RESISTOR | 99901 | ZERO-ICHI SALES CO., LTD | 99999 | RESISTOR MANUFACTURER | XJA771 | NOT INVESTIGATED |

UPON SELECTION OF COMPONENT, SELECTED COMPONENT SERVES AS TARGET COMPONENT

[ < RETURN ]   [ CANCEL ]

FIG. 6

| COMPANY NAME | COMPANY CODE | MATERIAL NAME | JIS CODE | CONSTITUENT NAME | CAS | CONTENT RATIO OF CHEMICAL SUBSTANCE (LOWER LIMIT) | CONTENT RATIO OF CHEMICAL SUBSTANCE (UPPER LIMIT) |
|---|---|---|---|---|---|---|---|
| COMPANY B | 12301 | CARBON STEEL | S30C | CARBON | 7440-44-0 | 0.20wt% | 0.30wt% |
| COMPANY B | 12301 | CARBON STEEL | S30C | SILICON | 7440-21-3 | 0.20wt% | 0.25wt% |
| COMPANY B | 12301 | CARBON STEEL | S30C | MANGANESE | 7439-96-5 | 0.70wt% | 0.75wt% |
| COMPANY B | 12301 | CARBON STEEL | S30C | PHOSPHOR | 7723-14-0 | 0.010wt% | 0.020wt% |
| COMPANY B | 12301 | CARBON STEEL | S30C | SULFUR | 7704-34-9 | 0.020wt% | 0.030wt% |
| COMPANY B | 12301 | CARBON STEEL | S30C | IRON | 7439-89-6 | 97.8wt% | 98.0wt% |

FIG. 7

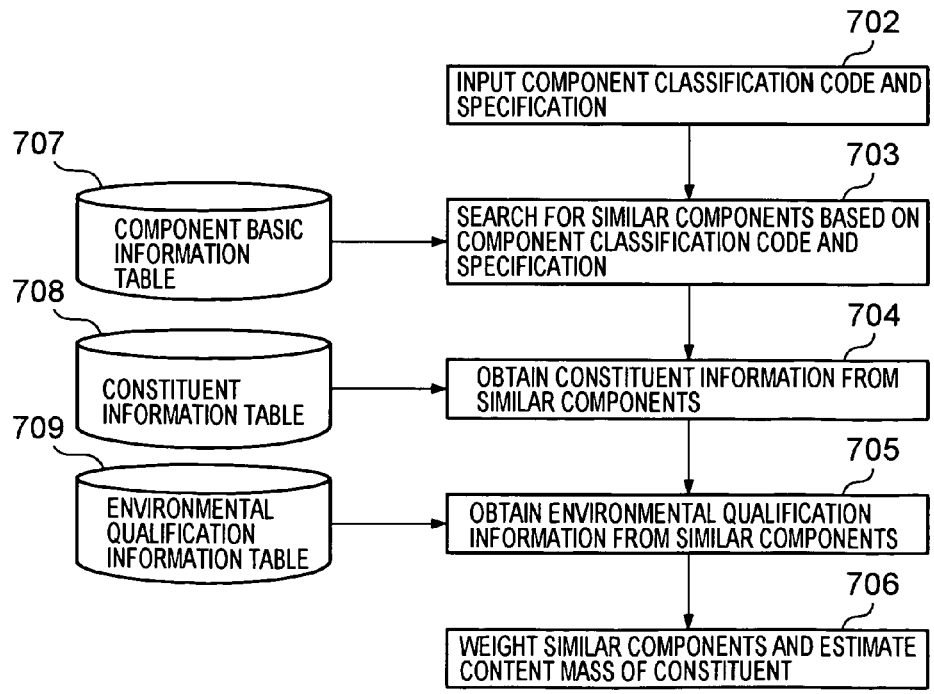

FIG. 8

| SIMILAR COMPONENT →<br>QUALIFICATION INFORMATION ↓ | COMPONENT A | COMPONENT B | COMPONENT C |
|---|---|---|---|
| ESTABLISHMENT α | PASS | FAIL | FAIL |
| ESTABLISHMENT β | PASS | PASS | FAIL |
| ESTABLISHMENT γ | FAIL | NOT INVESTIGATED | NOT INVESTIGATED |
| ESTABLISHMENT δ | NOT INVESTIGATED | NOT INVESTIGATED | NOT INVESTIGATED |
| NUMBER OF INVESTIGATING ESTABLISHMENTS | 3 | 2 | 2 |
| PASS RATE | 67% | 50% | 0% |

FIG. 9

| CONSTITUENT NAME ↓ | COMPONENT A | COMPONENT B | COMPONENT C | TARGET COMPONENT |
|---|---|---|---|---|
| LEAD | 0mg | 2mg | 1mg | 0.9mg |
| ANTIMONY TRIOXIDE | 2mg | 1mg | 1mg | 1.4mg |
| NICKEL | 1mg | 0mg | 1mg | 0.7mg |
| SILVER | 1mg | 1mg | 1mg | 1.0mg |
| COMPONENT MASS | 1g | 2g | 1g | 1.3g |

FIG. 11

| Environmental Qualification Information | Sb | As | Ni | PVC | Cu | Ag | Item Number | Establishment |
|---|---|---|---|---|---|---|---|---|
| PASS | NOT CONTAINED | NOT CONTAINED | CONTAINED | NOT CONTAINED | CONTAINED | NOT CONTAINED | A | ESTABLISHMENT α |
| PASS | NOT CONTAINED | NOT CONTAINED | CONTAINED | NOT CONTAINED | CONTAINED | NOT CONTAINED | A | ESTABLISHMENT β |
| PASS | NOT CONTAINED | NOT CONTAINED | CONTAINED | NOT CONTAINED | CONTAINED | NOT CONTAINED | A | ESTABLISHMENT γ |
| PASS | NOT CONTAINED | NOT CONTAINED | CONTAINED | NOT CONTAINED | NOT CONTAINED | CONTAINED | B | ESTABLISHMENT α |
| PASS | NOT CONTAINED | NOT CONTAINED | CONTAINED | NOT CONTAINED | NOT CONTAINED | CONTAINED | B | ESTABLISHMENT β |
| PASS | NOT CONTAINED | NOT CONTAINED | CONTAINED | NOT CONTAINED | CONTAINED | NOT CONTAINED | C | ESTABLISHMENT β |
| FAIL | UNDER INVESTIGATION | NOT CONTAINED | CONTAINED | NOT CONTAINED | CONTAINED | NOT CONTAINED | C | ESTABLISHMENT ε |
| PASS | UNDER INVESTIGATION | NOT CONTAINED | CONTAINED | UNDER INVESTIGATION | CONTAINED | NOT CONTAINED | D | ESTABLISHMENT α |
| FAIL | NOT CONTAINED | NOT CONTAINED | CONTAINED | UNDER INVESTIGATION | CONTAINED | NOT CONTAINED | D | ESTABLISHMENT δ |
| PASS | NOT CONTAINED | NOT CONTAINED | NOT CONTAINED | NOT CONTAINED | CONTAINED | NOT CONTAINED | E | ESTABLISHMENT ε |
| FAIL | UNDER INVESTIGATION | NOT CONTAINED | CONTAINED | NOT CONTAINED | CONTAINED | UNDER INVESTIGATION | F | ESTABLISHMENT α |
| FAIL | CONTAINED | NOT CONTAINED | NOT CONTAINED | UNDER INVESTIGATION | CONTAINED | NOT CONTAINED | G | ESTABLISHMENT β |
| FAIL | CONTAINED | UNDER INVESTIGATION | NOT CONTAINED | CONTAINED | CONTAINED | NOT CONTAINED | H | ESTABLISHMENT γ |
| FAIL | NOT CONTAINED | NOT CONTAINED | CONTAINED | UNDER INVESTIGATION | CONTAINED | UNDER INVESTIGATION | I | ESTABLISHMENT γ |
| ??? | NOT CONTAINED | NOT CONTAINED | CONTAINED | UNDER INVESTIGATION | CONTAINED | UNDER INVESTIGATION | J | |

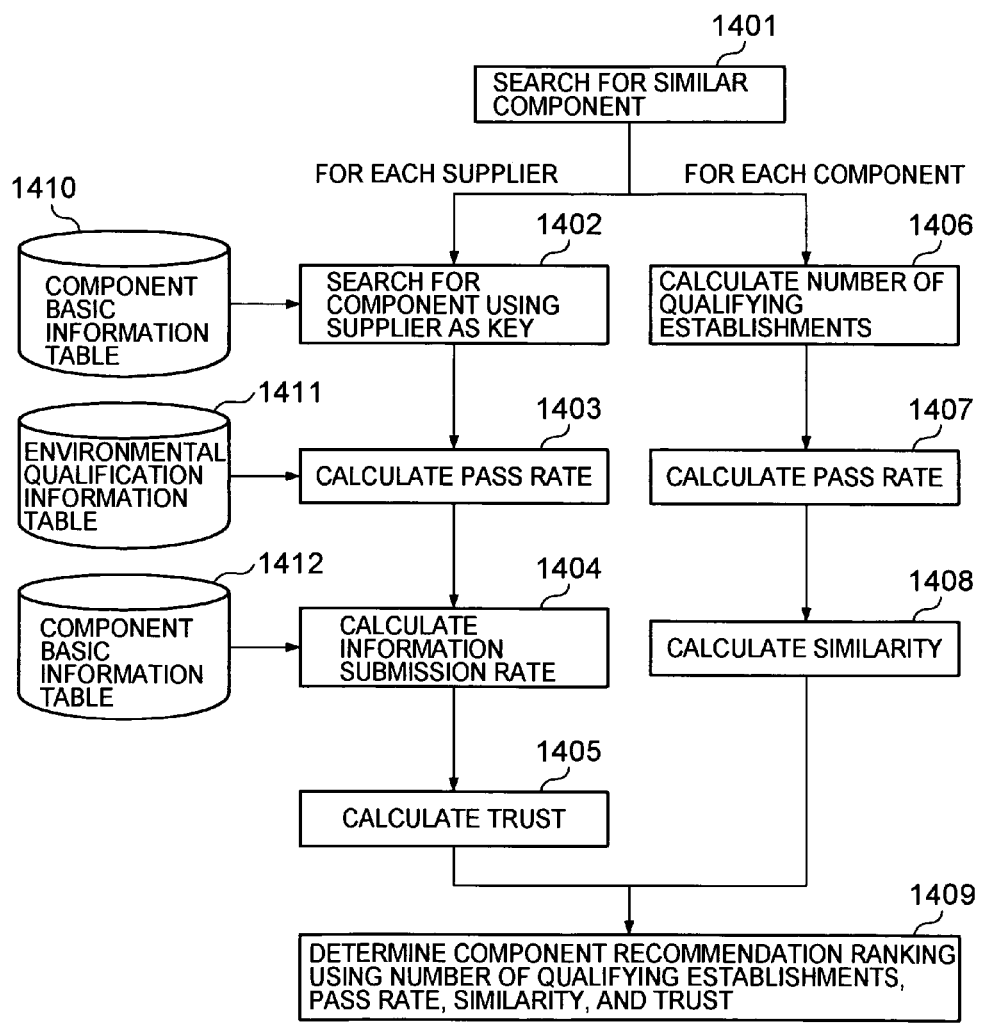

FIG. 15

EXAMPLE OF SEARCH FOR COMPONENT INFORMATION USING SUPPLIER AS KEY

| COMPANY NAME | COMPANY CODE | ITEM NAME | ITEM NUMBER | ECALS CODE | RESULT OF INVESTIGATION | CONSTITUENT INFORMATION |
|---|---|---|---|---|---|---|
| COMPANY A | 12300 | PRINTED WIRING BOARD | A-67 | XJA246 | - | UNDER INVESTIGATION |
| COMPANY A | 12300 | RESISTOR | A-8901 | XJA003 | PASS | REGISTERED |
| COMPANY A | 12300 | RESISTOR | A-8902 | XJA003 | - | REGISTERED |
| COMPANY A | 12300 | CAPACITOR | A-0101 | XJA035 | PASS | REGISTERED |
| COMPANY A | 12300 | CAPACITOR | A-0102 | XJA035 | FAIL | UNDER RE-INVESTIGATION |
| COMPANY A | 12300 | CAPACITOR | A-0103 | XJA035 | - | UNDER INVESTIGATION |

PASS RATE ... 67%

REGISTRATION RATE ... 80%

TRUST OF COMPANY A ... REGISTRATION RATE × PASS RATE × 100 = 53.6 POINTS

FIG. 16

| COMPANY NAME | COMPANY CODE | ITEM NAME | ITEM NUMBER | ECALS CODE | NUMBER OF QUALIFYING ESTABLISHMENTS | PASS RATE | SIMILARITY | TRUST | RECOMMENDATION RANKING |
|---|---|---|---|---|---|---|---|---|---|
| COMPANY A | 12300 | PRINTED WIRING BOARD | A-67 | XJA246 | 0 | - | 64.8% | 40.2 | 4 |
| COMPANY C | 12303 | PRINTED WIRING BOARD | C-5678 | XJA246 | 2 | 100% | 16.2% | 80 | 2 |
| COMPANY D | 12304 | PRINTED WIRING BOARD | D-9012 | XJA246 | 3 | 75% | 10.0% | 90 | 1 |
| COMPANY E | 12305 | PRINTED WIRING BOARD | E-3456 | XJA246 | 0 | - | 0% | 20 | 6 |
| COMPANY F | 12306 | PRINTED WIRING BOARD | F-7890 | XJA246 | 0 | - | 0% | 30 | 5 |
| COMPANY G | 12307 | PRINTED WIRING BOARD | G-1234 | XJA246 | 2 | 50% | 100% | 0 | 3 |

METHOD, SYSTEM AND PROGRAM FOR EVALUATING RELIABILITY ON COMPONENT

BACKGROUND OF THE INVENTION

Currently, various countries are enacting or enforcing regulations for restricting use of a specific constituent. Such the regulation include the RoHS (Restriction on Hazardous Substances) directive or the ELV directive (End of Life Vehicles Directive) in the EU. In this situation, management of constituents contained in a product is urgent necessity for product manufacturers. In particular, a method for certificating non-containment of a prohibited constituent has become an issue for each of the manufactures.

Assemblers and the like generally do not manufacture components in their own factories and employ process of purchasing the components from component manufacturers and the like, and then assemblers assemble a product with the purchased components. In this case, for example, the assembler requests the suppliers to provide with constituent information of the components constituting the product so as to obtain constituent information of the product which is manufactured by the assembler. In response to such a requirement, the green procurement movement has recently been promoted in manufacturers so as to urge component suppliers (hereinafter, referred to simply as "suppliers"; including component venders and component manufacturers) to investigate and provide constituent information of components. The provided information is accumulated in a component information database of the product manufacturer.

In order to confirm constituent information of components, a designer in the manufacturer or the like searches for information of a target component from the component information database to confirm the component information so as to decide on a component as a component for constituting a product. In many cases, however, not all the component information that the designer wants to know is provided by the suppliers. In addition, even if the component information is registered, the registered contents are insufficient, information quality differs between the suppliers, or some suppliers provide the component information without conducting full investigation thereof. Moreover, since each supplier has a different idea about constituent information, the quality of provided constituent information frequently varies depending on the suppliers which provide the constituent information. However, since there is no means of examining such component information quality at present, it is impossible to fully examine whether or not a target component conforms to regulations. Accordingly, the conformity of a component to environmental regulations (hereinafter, referred to simply as "conformity") cannot be precisely evaluated.

In view of such a situation, the assemblers try to ensure the credibility of information by a method of obliging the suppliers to submit non-containment certificates or the like. However, an amount of information available at early stages of design is limited in many cases. Therefore, the assemblers are required to evaluate the credibility of components based on a limited amount of constituent information provided by the suppliers at early stages of design to confirm the conformity of the components to the environmental regulations.

As a technology of evaluating the credibility of components, Japanese Patent Laid-open Publication No. 2004-038656, "Product design support device and method", proposes a product design support device which has functions of designating a range of a specification value to search for a component satisfying the range of the specification value as a recommended component and of accepting the registration made by a designer in terms of a recommended component to give the recommended component higher priority to be selected as a recommended component for the next component search.

Japanese Patent Laid-open Publication No. H 11-238069, "Component selection device", discloses a component selection device which has functions of searching a database for alternative components for a certain component designated by an item code and of deriving a recommendation ranking of the alternative components based on data such as reliability, cost, an inventory condition of the alternative components for the certain component.

Japanese Patent Laid-open Publication No. 2002-049649, "Environment information simulation system, device, and method, and recorded medium", describes an environment information simulation system which has the function of evaluating a conformity status of a certain component, even if whose constituent information has not been registered to environment regulations, by using a weighted average value of constituent information of similar components as constituent information of the certain component.

Japanese Patent Laid-open Publication No. 2003-203105, "Product check system, information setting check device, product-related information providing device, and product check support device", discloses a product check system and the like having the following function. In the product check system, a database is created which includes information on components most likely to be contained by each type of component. Upon input of a constituent that should be reported, a supplier also inputs the type of the component. With respect to the type of the component thus input, a constituent that is highly likely to be contained in the component is extracted from the database to be compared with the input constituent content. When no constituent corresponding to the report is extracted from the database, a message is sent to the reporter so as to prompt reconfirmation.

Throughout this specification, the term "component" denotes both a "part" which constitutes a product and demonstrates a part of a function of the product and a "material" which signifies a raw material necessary for manufacturing the part. The term "constituent" denotes a physical constituent element necessary for producing the material. For example, a chemical substance is one of the constituents.

The systems and devices described in the above-cited documents are for estimating component information of a target component based on information of components similar to the target component (Japanese Patent Laid-open Publication No. 2002-049649) or extracting a recommended component from the specifications designated by a designer (Japanese Patent Laid-open Publication No. 2004-038656 and Japanese Patent Laid-open Publication No. H 11-238069). However, the systems and devices cannot evaluate the accuracy of the similar component information, that is, the accuracy of the component information provided by the supplier to output the result of evaluation.

Moreover, in the case where the constituent information of the component information to be evaluated is estimated using the similar component information to verify the conformity of the target component, there is no means of verifying whether the result of evaluation of the conformity is credible or not. Therefore, even if the result of evaluation of the conformity is obtained, it is sometimes difficult to perfectly avoid the risk of inconformity to regulations, because the credibility of the result of evaluation is not definite.

Furthermore, even if the result of evaluation of the conformity of the target component is obtained, there is no means of ensuring that the target component can avoid the risk of inconformity to regulations. Moreover, in the above-cited related art, if the target component turns out not to conform to the regulations, the designer is required to select a target component again. Therefore, a large number of steps are needed for the designer to select a component, which impairs efficiency.

SUMMARY OF THE INVENTION

It is therefore an object of the present invention to provide a method for supporting a designer in confirming constituent information of a component at early stages of design and a device capable of evaluating constituent information of a target component and conformity of the target component to environmental regulations by using the method.

In order to attain the above object, the present invention provides a system for evaluating constituent information, which evaluates credibility of an evaluation result of conformity of a component to environmental regulations, the system including: an input unit; an output unit; a processing unit; and a memory unit, in which the memory unit includes: a component basic information table which retains identification information that distinguishes each item; a constituent information table which retains constituents contained in the component and a content of each of the constituents; and an environmental qualification information table which retains constituents contained in the component for each item and a evaluation result of conformity of the component to environmental regulations, and in which the processing unit includes: means which accepts selection of a target component through the input unit; means which calculates constituents contained in the target component and a content of each of the constituents by referring to the constituent information table based on identification information of the target component and evaluates conformity of the constituent to environmental regulations based on the content; means which extracts a component similar to the target component by referring to the environmental qualification information table and calculates constituents contained in the similar component and a content of each of the constituents; and means which evaluates credibility of the evaluation of the conformity to environmental regulations based on a difference between the content of the constituent in the target component and the content of the constituent in the similar components, the constituent being used for the evaluation of the conformity to environmental regulations among the constituents contained in the target component. Furthermore, the present invention provides a method and a program for evaluating reliability on constituent information used for the system for evaluating reliability on constituent information.

According to the present invention, the processing unit may further include: means which accepts selection of a status re-investigation, adoption and non-adoption, of the target component, through the input unit; means which makes a re-investigation request attached with the result of investigation of the target component to a manufacturer of the component when the re-investigation is selected as the status; means which makes a qualification request to a component final confirmation personnel when adoption is selected as the status; and means which returns to the input unit of basic information of the target component when non-adoption is selected as the status. Specifically, according to the present invention, conformity of the evaluated target component, credibility of the component information, and a result of verification of the target component by the designer are stored as a part of the component information. From then on, when information of the target component is found in the search, the result of verification is output. Moreover, for the target component not qualified by the designer as being not conforming to the environmental regulations, the supplier is requested to provide information again so as to assure the conformity. As a result, it is possible to support the operations regarding component information.

Also, according to the present invention, the component similar to the target component can be extracted by referring to the component basic information table and by searching for the similar component based, on the identification information of the target component according to a definition of the similar component. Also, it is desirable to calculate each of the constituents contained in the target component and the content of the constituent based on constituent information of the component similar to target component, which is obtained from the constituent information table, the constituent information being weighted based on environmental qualification information of the similar component obtained from the environmental qualification information table.

Further, according to the present invention, it is possible to provide the processing unit with: means which searches for a component similar to the target component, obtains constituent information of the target component and the similar component from any one of the constituent information table and the result of calculation of the constituent information, and estimates the environmental qualification information of the target component by using at least a part of the obtained constituent information as an explaining variable and environmental qualification information of the target component and the similar component extracted from the environmental qualification information table as an explained variable; and means which calculates an accuracy of the estimation.

Also, it is possible to further provide the processing unit with: means which searches for a component similar to the target component and calculates a trust of each of suppliers based on at least a part of data quality of a component provided by each of the suppliers and information about quality of the component, for the suppliers of the target component and the similar components; and means which determines recommendation ranking of the target component and the similar components from the result of calculation of the trust of each of the suppliers and the result of estimation of the environmental qualification information of the target component and the similar components. In this manner, based on the conformity of the component information of the target component evaluated by the present invention, a registration rate of component information provided by the supplier, and a conformity rate of the component provided by the supplier, recommendation ranking of the target component and the similar components are calculated to thereby support the designer in selecting a component.

According to the present invention, the designer can search for candidate components based on abstract information such as a specification value of the component, the designer can evaluate the conformity of the candidate components to environmental regulations even if an amount of information provided by the supplier is small. Moreover, according to the present invention, the recommendation ranking of a plurality of candidate components is clearly defined, which allows the designer to easily select a component to be used. Furthermore, according to the present invention, the operation of requesting the supplier to collect information of the candidate components or the operation of requesting a quality assurance monitor to qualify the component can be provided seamlessly.

BRIEF DESCRIPTION OF THE DRAWINGS

In the accompanying drawings:

FIG. 2 is an explanatory view showing an exemplary screen which allows setting of component search conditions according to the embodiment;

FIG. 3 is an explanatory view showing an exemplary screen on which the result of a component search is displayed according to the embodiment;

FIG. 6 is an explanatory view of a material information database according to the embodiment;

FIG. 7 is a flowchart showing a process which estimates the constituent information from similar component information according to the embodiment;

FIG. 8 is an explanatory view showing an exemplary screen on which qualification information of the similar components is displayed according to the embodiment;

FIG. 9 is an explanatory view showing exemplary numerical values in the process which estimates the constituent information from the similar component information according to the embodiment;

FIG. 11 is an explanatory view showing an exemplary screen on which substance group information of the similar components is displayed according to the embodiment;

FIG. 14 is a flowchart showing a process which calculates recommendation ranking of candidate components according to the embodiment;

FIG. 15 is an explanatory view showing an exemplary screen on which a trust of a supplier is calculated and displayed according to the embodiment;

FIG. 16 is an explanatory view showing an exemplary screen on which the recommendation ranking of the candidate components is displayed according to the embodiment.

DETAILED DESCRIPTION OF THE PREFERRED EMBODIMENTS

Hereinafter, an embodiment of the present invention will be described. However, the present invention is not limited thereto. In this embodiment, the details of an evaluation system of credibility of constituent information, which supports a designer in evaluating the conformity of a target component to select a component having the least risk of inconformity to environmental regulations, will be described.

(1) Overall Configuration

Figure 1:
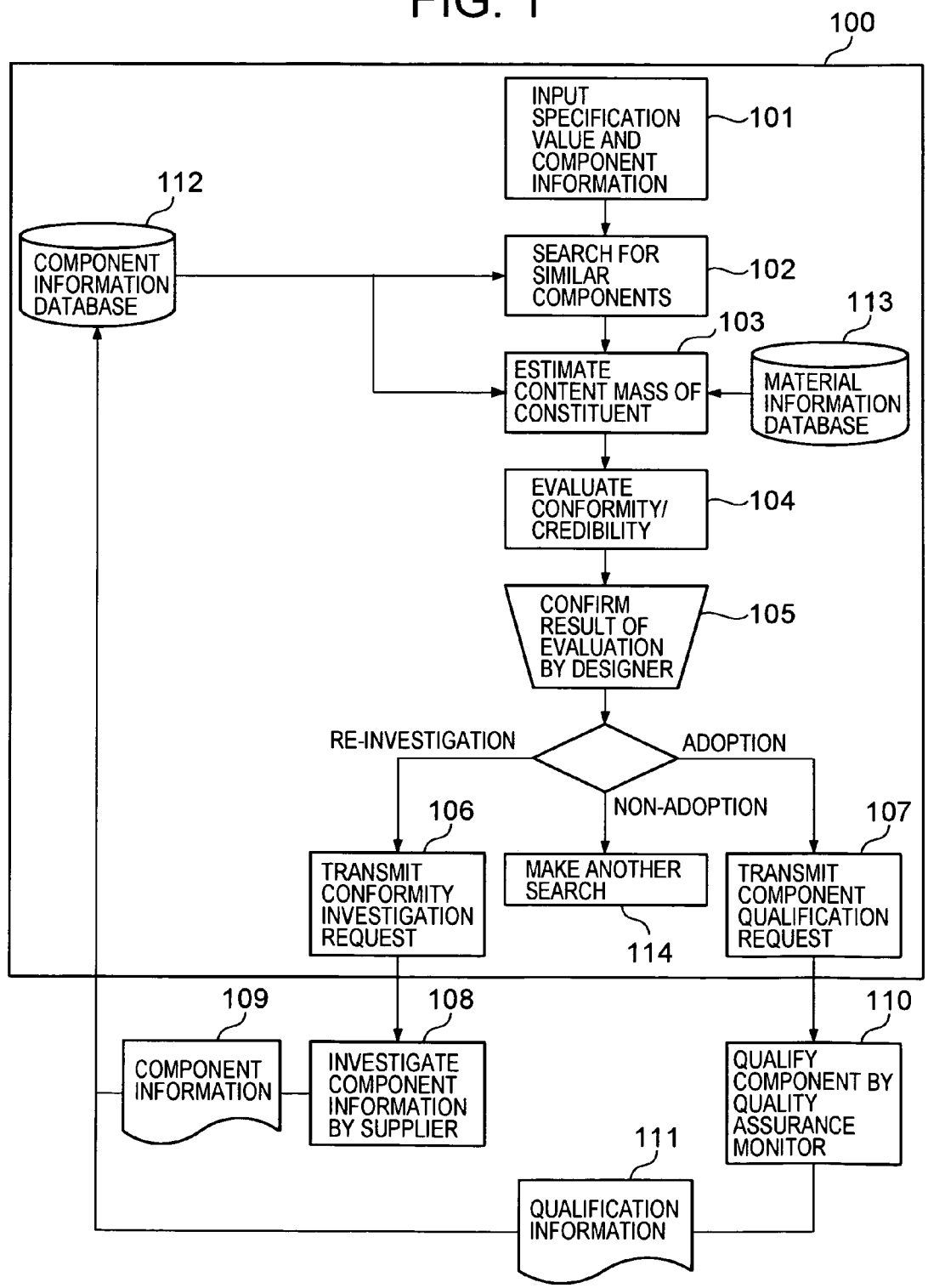
FIG. 1 is a functional configuration diagram of an evaluation system of credibility of constituent information according to an embodiment.
Figure 17:
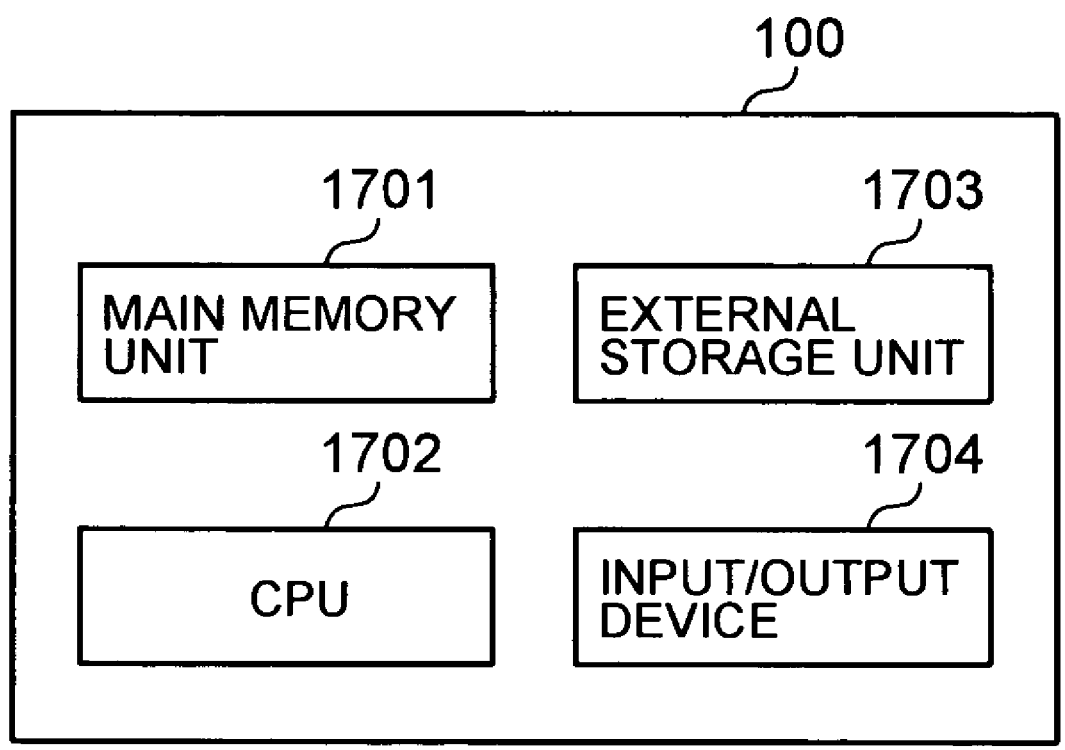
FIG. 17 is a hardware configuration diagram according to the embodiment.

A hardware configuration of a constituent information credibility evaluation system 100 according to this embodiment is shown in FIG. 17, while its functional configuration is shown in FIG. 1.

The system 100 according to this embodiment is, as shown in FIG. 17, an information processing device (computer) including a main memory unit 1701, a central processing unit (processing unit) 1702, an external storage unit (storage unit) 1703, and an input/output device (an input unit and an output unit) 1704. The external storage unit 1703 retains a component information database 112 and a material information database 113. Each of means 101 to 107 constituting the system 100 is realized by the execution of a program by the central processing unit 1702, the program being retained in the external storage unit 1703 and being read by the main memory unit 1701. The result of execution of the program by the central processing unit 1702 is stored in the external storage unit 1703 or is output through the input/output device 1704. Although each of the means 101 to 107 is realized by the execution of software with such a general information processing device in this embodiment, the present invention is not limited thereto. Each of the means 101 to 107 may be realized by the combination of special-purpose hardware or the like.

A designer of a product wants to obtain candidate components having a low environmental load for the selection of a component to be used for the product. The designer inputs a specification value, a component number unique to a component, and the like as identification information of the component to the system 100 to search through the component information database 112. When selecting a target component from the components found in the search in a step 102, the designer is required to check constituent information of the components so as to evaluate the conformity to environmental regulations. However, the component information database does not always contain constituent information. In some cases, constituent information is not even provided by a supplier. Therefore, the constituent information credibility evaluation system 100 in this embodiment refers to material composition information of a target component and the material information database 113 or refers to constituent information of components similar to the target component to estimate the constituent information of the target component in a step 103 so as to evaluate the conformity of the target component in a step 104.

Moreover, if constituent information is not approved by anyone even though the constituent information of the target component is provided by a supplier, it is unclear whether the constituent information is credible or not. Therefore, the constituent information credibility evaluation system 100 according to this embodiment compares the constituent information of the target component with the constituent information of similar components that have already been qualified among the components similar to the target component to estimate the credibility of the constituent information of the target component, and outputs the result of evaluation. The designer can confirm the result of evaluation in a step 105 to determine whether or not to use the target component.

If the designer selects re-investigation of the component information, the constituent information credibility evaluation system 100 accepts the selection and transmits a request for re-investigation attached with the result of evaluation (step 108) to the supplier in a step 106. If the designer selects the adoption of the target component, the constituent information credibility evaluation system 100 transmits a request for component qualification (step 110) to a quality assurance monitor in a step 107. If the designer selects non-adoption of the component, the constituent information credibility evaluation system 100 accepts the selection, searches for a component again in a step 114 and then returns the processing to the step 102.

In the case of the re-investigation (step 106), the component information database 112 accepts and stores component information 109 corresponding to the result of re-investigation by the supplier. In the case of the component adoption (step 107), the component information database 112 accepts and stores information containing the result of component qualification by the quality assurance monitor. The component information 109 and qualification information 111 are in cooperation with the constituent information credibility evaluation system 100 so as to be used by the designer in real time for the component search.

(2) Search for Candidate Components

First, means which searches for candidate components will be described. The system 100 first accepts identification information of a component to be searched for. The identification information accepted by the system 100 is exclusively an item code at the supplier. However, information to be input may be a specification value of a target component, an item code of each of the components constituting the target component, or a general appellation of the component. Herein, the term "specification value" denotes a value quantitatively representing the performance of a component. The "specification value" corresponds to, in the case of a capacitor, for example, a capacitance, a size, a temperature characteristic, or the like. The term "item code" denotes an identification number unique to a component corresponding to a component name officially announced by a supplier or an identification number unique to the component described in drawings and the like by a designer.

Upon input of identification information, the system 100 searches the component information database 112 for a corresponding component based on the identification information. When a search key is a supplier name, an item name, or the like, the identification information is searched for by perfect match or partial match of the supplier name or the item name. When a search key is composed of symbols as in the case of a supplier code or an item code, a so-called "fuzzy search" for a search with spaces ignored or a case-insensitive search is implemented (a screen image at this time is shown in FIG. 2).

Next, the system 100 outputs a list of components found in the search to a search result screen. At this time, in addition to output on the screen, the list of the components may also be output in the form of another file such as that of spreadsheet software. On the search result screen, the system 100 accepts the selection of a target component whose conformity and credibility of the constituent information are desired to be evaluated from the plurality of components found in the search.

On the other hand, the component information database is searched for similar components mainly based on information that does not specify components such as a specification value of a component and a component code. A search result screen image of the target components and the similar components is shown in FIG. 3.

(3) Evaluation of Conformity to Environmental Regulations

Next, means which evaluates the conformity of the target component to environmental regulations will be described.

The component information database includes at least a constituent information table which retains constituent information of each of the components and a material composition information database.

For example, if a chemical substance is used as a constituent, the constituent information herein is associated with a chemical substance code, a chemical substance name, or a content mass or ratio of the chemical substance contained in the component with the use of an item code of the component as a key. The chemical substance code is an identification number which serves to specify a chemical substance, and a generally-used code can be used as the chemical substance code. In this embodiment, a CAS Registry Number defined by American Chemical Society is used.

The material composition information is associated with a material code, a material name, or a material mass or ratio of the material constituting the component with the use of an item code of the component as a key. The material code is an identification number for specifying the material, and a generally-used material code can be used as the material code. In this embodiment, a JIS code is used as the material code.

Figure 4:
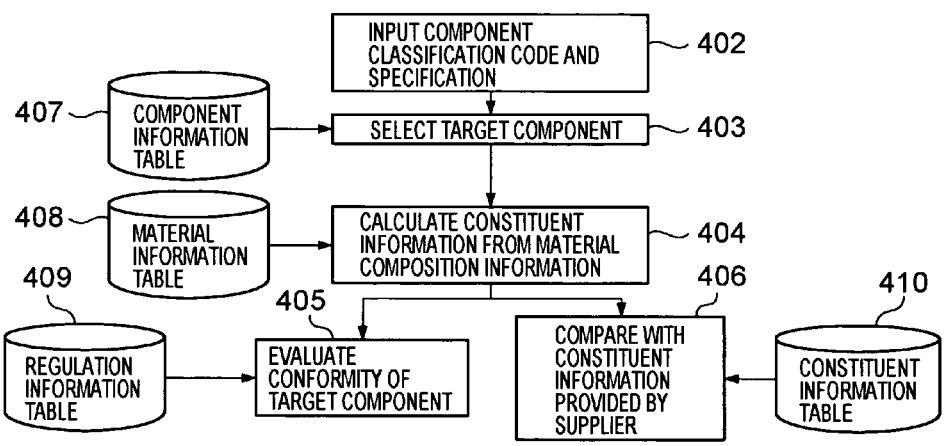
FIG. 4 is a flowchart showing a process which estimates constituent information from material composition information according to the embodiment.
Figure 5:
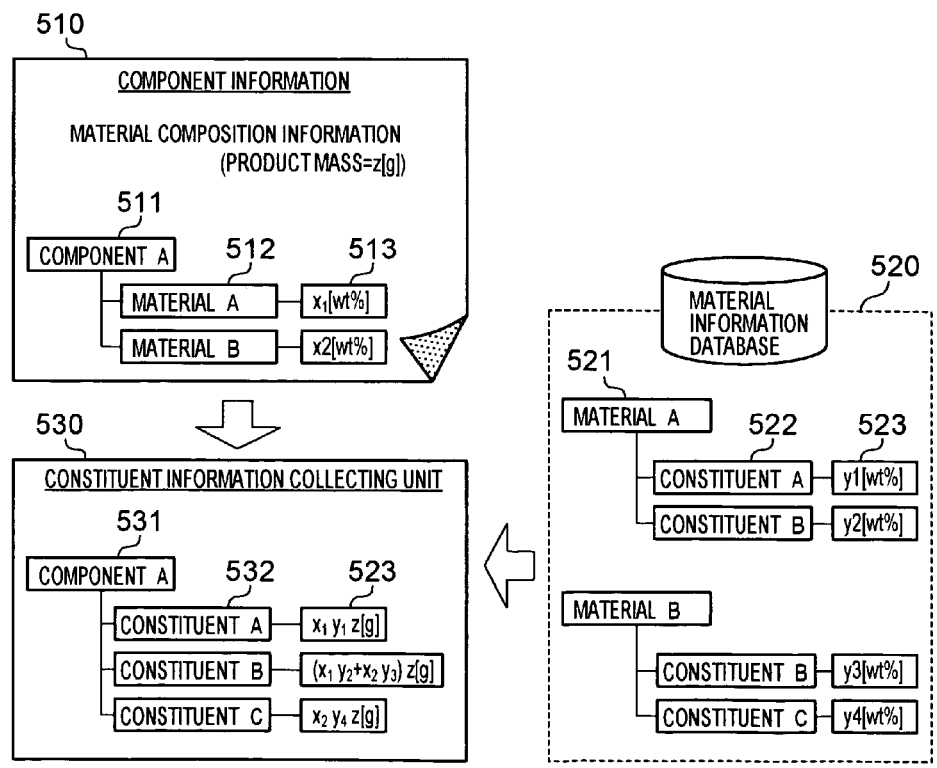
FIG. 5 is an explanatory view of a data coordination method which allows estimation of the constituent information from the material composition information according to the embodiment.

As the first evaluation means of the conformity, means which evaluates the conformity of the target component in the case where constituent information of the target component is provided by a supplier will be described with reference to FIG. 4.

The system 100 searches a component information table 407 constituting the component information database, for information of a target component or similar components. If material composition information is that of the component which has already been registered, constituent information 530 is estimated based on material composition information 510 of the target component or the similar components by referring to the material information database 520.

The material information table 408 constituting the material information database is registered with content ratio information of the material for the material code. An example of the content of the material information database is shown in FIG. 6. A content ratio of each constituent may be fixed or may be the range defined by a lower limit and an upper limit as shown in FIG. 6.

The system 100 uses a material code 512 of the material composition information associated with the item code 511 as a key to search through the material information database. Then, the system 100 relates a constituent code 522 and a content ratio 523 of the constituent with the item code 521, and multiplies a material mass constituting the target component or the similar component with a content ratio of each material to calculate (estimate) each constituent and its content in constituent information 533 of the target component.

The result of estimation of the constituent information is used for comparing the estimated constituent information with the constituent information provided by the supplier in a step 406 to examine the credibility of the component information provided by the supplier when the constituent information of the target component is independently provided by the supplier. The result of estimation of the constituent information is also used for comparing the result of estimation of the constituent information with information of regulations in a step 405 to evaluate the conformity of the constituent to environmental regulations. In this case, it is not necessary to consider whether the constituent information is provided by the supplier or not. The effect of this means is that the material composition information can be converted into the constituent information to provide the means which examines the constituent information to support the designer in rapidly adopting a component.

Next, means which estimates constituent information from a similar component in the same classification of the target component to evaluate the conformity of the target component even if the constituent information of the target component is not provided will be described (FIG. 7). In this case, the constituent information or the material composition information of the target component is not required.

First, the system 100 accepts the input of the component information by the designer in a step 702. Then, in a step 703, the system 100 searches for components similar to the target component by the above-described similar component search method to find constituent information of the similar components from a constituent information table 708 constituting the component information database 112 in a step 704 and to temporarily store the found constituent information in the system. Subsequently, in a step 705, the system 100 searches an environmental qualification information table 709 constituting the component information database 112, for environmental qualification information of the similar components whose constituent information are found, and in step 706, estimates the constituent information of the target component based on the result of the search.

An example of the estimating method will be described below. As shown in FIG. 8, a plurality of qualification information are present for the same component. Therefore, the number of records with the result of investigation being not "not investigated" is set as the number of establishments that have investigated the component (in the example shown in FIG. 8, three establishments) and is reflected on weighting of the constituent information of the similar component. Specifically, if the number of similar components is i, a content mass of a constituent j in the similar component i is qij, and the number of establishments that have investigated the similar component i is xi, a content mass Qj of the constituent j contained in the target component is calculated as the following formula (Formula 1).

$$Q_j = \frac{\sum_i q_{ij}(x_i + 1)}{\sum_i (x_i + 1)} \qquad \text{(Formula 1)}$$

An example of the result obtained by estimating the constituent information of the target component by the following formula based on the data shown in FIG. 8 is shown in FIG. 9.

A pass rate Rp of an estimated value of a content mass of a constituent of the target component is evaluated as follows. By using the number xi of establishments that have already investigated the similar components i and a total number yi of the similar components with the result of qualification "pass", the pass rate Rp is obtained by the following formula (Formula 2).

$$R_p = \frac{\sum_i y_i}{\sum_i x_i} \qquad \text{(Formula 2)}$$

The effect of this means is that the designer can evaluate the risk of inconformity to environmental regulations from the specifications of the component without waiting for the provision of information by the supplier. As a result, the selection of a component at the early stage of design can be facilitated.

(4) Evaluation of Environmental Qualification Information

Figure 10:
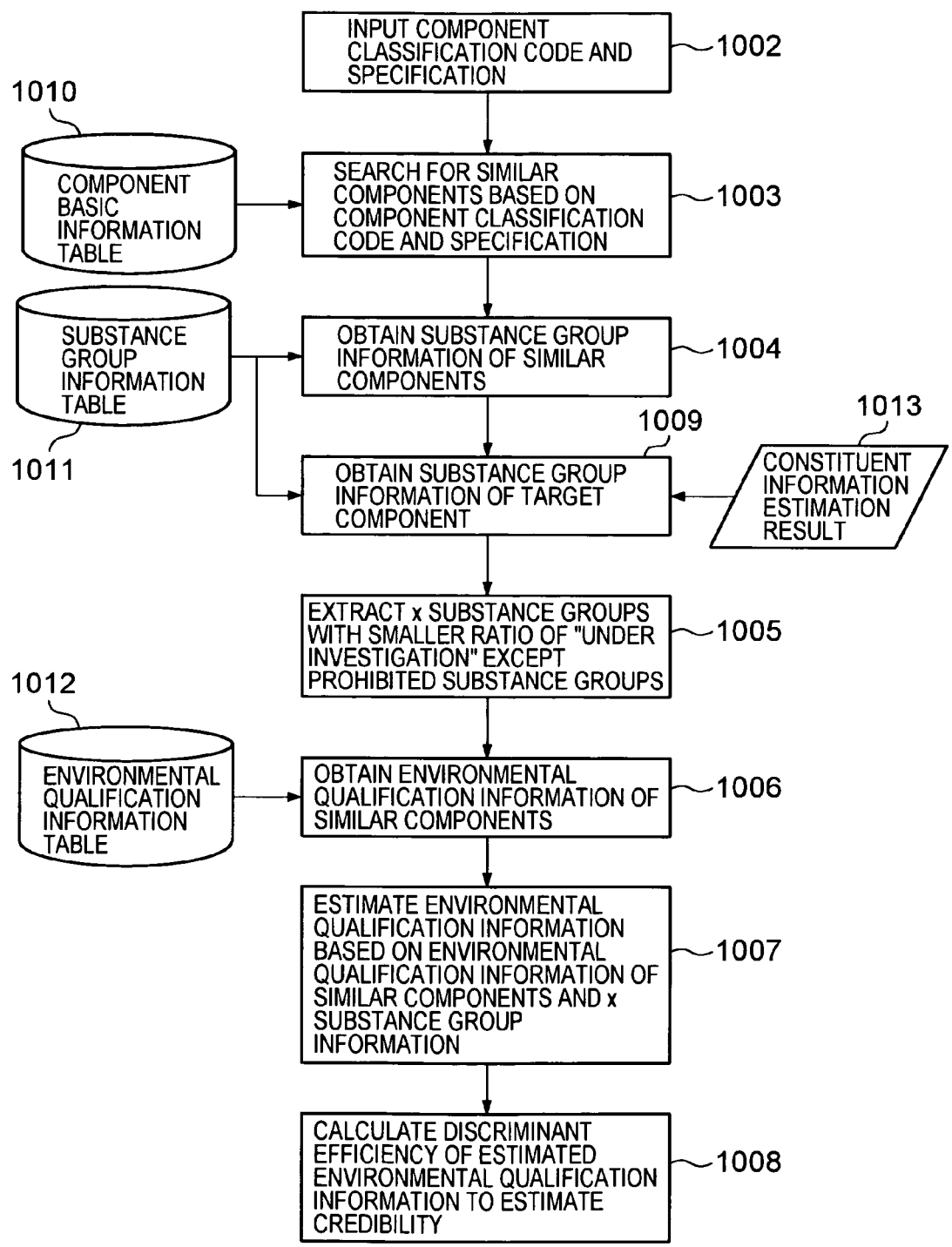
FIG. 10 is a flowchart showing a process which estimates environmental qualification information according to the embodiment.

Next, means which extracts the constituent information of the target component and the similar components to evaluate the environmental qualification information of the target component will be described with reference to FIG. 10. It is desirable that the constituent information of the target component be originally registered by the supplier, but the constituent information of the target component may be obtained by estimation based on the material composition information or the constituent information of the similar components by the above-described means.

In this embodiment, substance group information is used as the constituent information. The substance group information will now be briefly described. The substance group information is a kind of constituent information. However, the constituent information is data of a content mass of each specific constituent, while the substance information is containment information for each category of the constituents, determined for each constituent element (for example, lead and a lead monoxide both fall in the category of lead and its chemical substances). Examples of a method which creates the categories include a method which classifies constituents containing a specific element in the same category as in the case of "lead and its chemical substances", a method which classifies constituents based on the property of the constituents as in the case of "ozone-depleting substances", a method which classifies constituents based on regulations as in the case of "substances to be restricted by the EU RoHS directive". Although the containment information is normally in the form of content mass or rate, the containment information may also be discontinuous information such as the existence of a substance.

A flow of the process of evaluating the environmental qualification information in the constituent information credibility evaluation system 100 will be described with reference to FIG. 10. First, the system 100 searches for components similar to the target component. Since the means which searches for the similar components has already been described, the description thereof is herein omitted.

Next, in a step 1004, the system 100 obtains the substance group information of the similar components from a substance group information table 1011 constituting the component information database 112. The substance group information used herein is information which can have three variables, i.e., "contained", "not contained", and "under investigation" for the existence of a certain substance group.

Next, in a step 1005, the system 100 extracts x(x is an arbitrary number) substance groups in the order from the smallest ratio of "under investigation" except prohibited substance groups and stores substance group information of the extracted target component and similar components in the system.

Furthermore, in a step 1006, the system 100 obtains the environmental qualification information of the similar components (in this case, the environmental qualification information can have either "pass" or "fail" as a value, but the environmental qualification information may also have a value that does not correspond to either of the values, for example, "limited pass"). Furthermore, the system 100 obtains the substance group information of the target component (step 1009). Examples of a method which obtains the substance group information include a method which extracts the substance group information provided by the supplier from the substance group information table 1011 and a method which creates the substance group information based on the constituent information estimated in FIGS. 4 and 7.

When information as shown in FIG. 11 is collected by the above-described process, the system 100 obtains an estimate value of the environmental qualification information of the target component (step 1007). As an example of a method which estimates the environmental qualification information used herein, there is analysis using the quantification method II. According to this quantification method II, if an explaining variable (the substance group information in this case) and an explained variable (the environmental qualification information in this case) are both qualitative variables, the environmental qualification information of the target component is estimated based on the substance group information of the similar components and the substance group information of the similar components and the target component. The detailed description of the calculation method is herein omitted.

Subsequently, the system 100 obtains the accuracy of the thus obtained environmental qualification information of the target component by a calculation of a discriminant efficiency according to the quantification method II (step 1008). The accuracy is a value indicating the credibility of the result of evaluation.

The effect of this means is that an indefinitely large number of constituents are classified into categories to limit the number of types of constituent information. As a result, a load on an information provider is reduced to further facilitate the analysis. The constituent information is evaluated based on a broader concept of the constituents such as the substance group or discontinuous data such as the existence of a substance is used to allow the designer to evaluate the conformity to environmental regulations even if the range of information provided by the supplier is small. As a result, a load on the supplier is reduced to allow the designer to avoid the risk of inconformity to environmental regulations at the early stage of design.

(5) Evaluation of a Possibility of Qualification of Constituent Information

Figure 12:
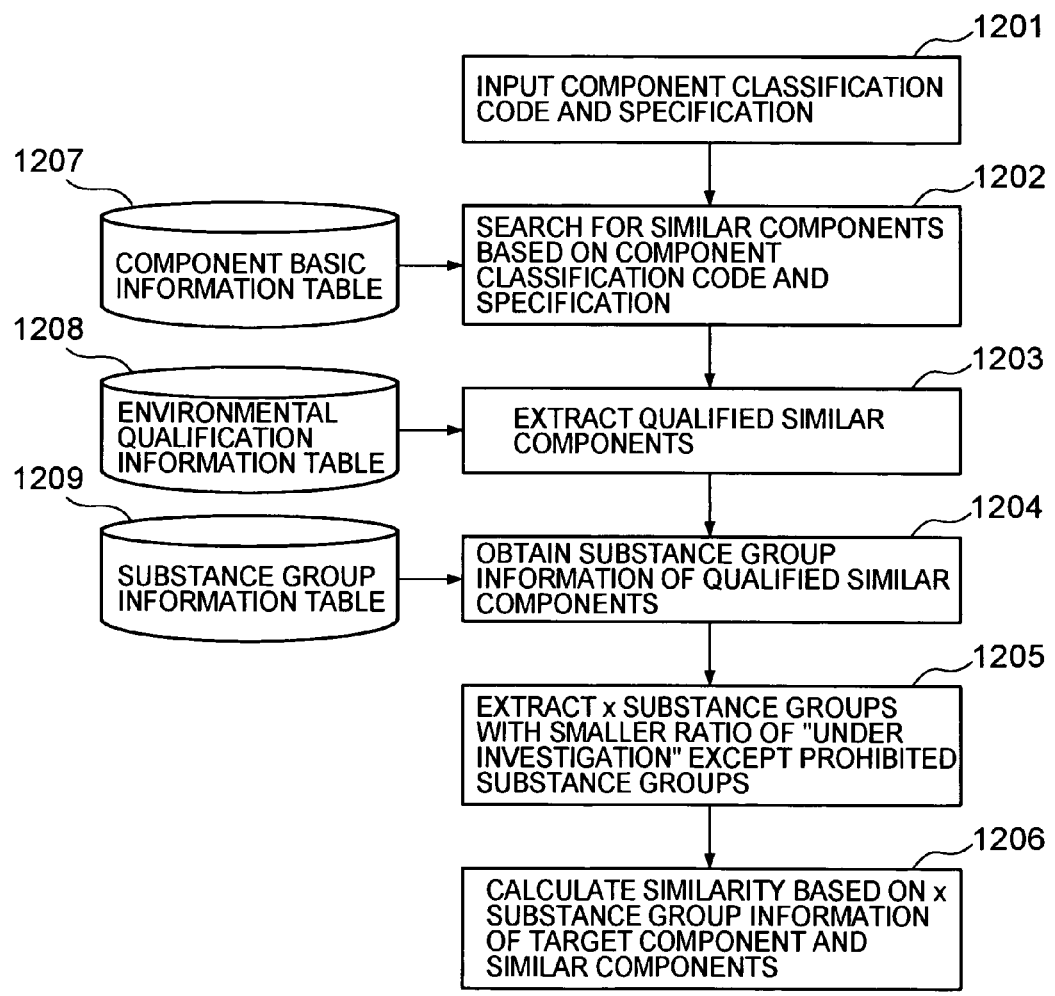
FIG. 12 is a flowchart showing a process which evaluates a similarity between a target component and the similar component according to the embodiment.

Next, means which extracts the substance group information of the target component and the qualified similar component and calculates a similarity of the similar component to the target component to evaluate a possibility of qualification of the constituent information of the target component will be described (FIG. 12).

For a similarity of constituent information between components, there is a method which compares content masses of a specific component. In many cases, however, a function inherent in the component is not only a characteristic of the component itself but also that of the elements constituting the component. Therefore, it is desirable to collectively examine the similarity for each substance group.

A process in the means which searches for the components similar to the target component is as described above. At this time, since the similar components used for the evaluation of a similarity are limited to those qualified, the system 100 in this embodiment searches for an environmental qualification information table 709 in a step 1204 subsequent to the search for the similar components. Next, the system 100 extracts x(x is an arbitrary number) substance groups having a small ratio of "under investigation" except the prohibited substance groups (step 1205) and calculates a similarity from the substance group information of the target component and the similar components (step 1206). The system 100 regards the similarity obtained in this step as the credibility of the constituent information of the target component. The system 100 outputs the thus obtained similarity through the input/output device 1704 so as to provide the similarity to a user as a reference value for selection of a component.

An example of the method which calculates the similarity will be described. Assuming that the extracted substance group is represented by i (i is a natural number from 1 to x), a possibility that a qualified component contains the substance group is Pi, a value indicating the existence of the substance group in the target component (for example, a value quantified in 1 in the case where the target component contains the substance group, 0.5 under investigation, and 0 in the case where the target component does not contain the substance group) is yi, a similarity R of the target component is obtained by the following formula (Formula 3).

$$R = \prod_{i=1}^{x} |P_i - y_i| \qquad \text{(Formula 3)}$$

Figure 13:
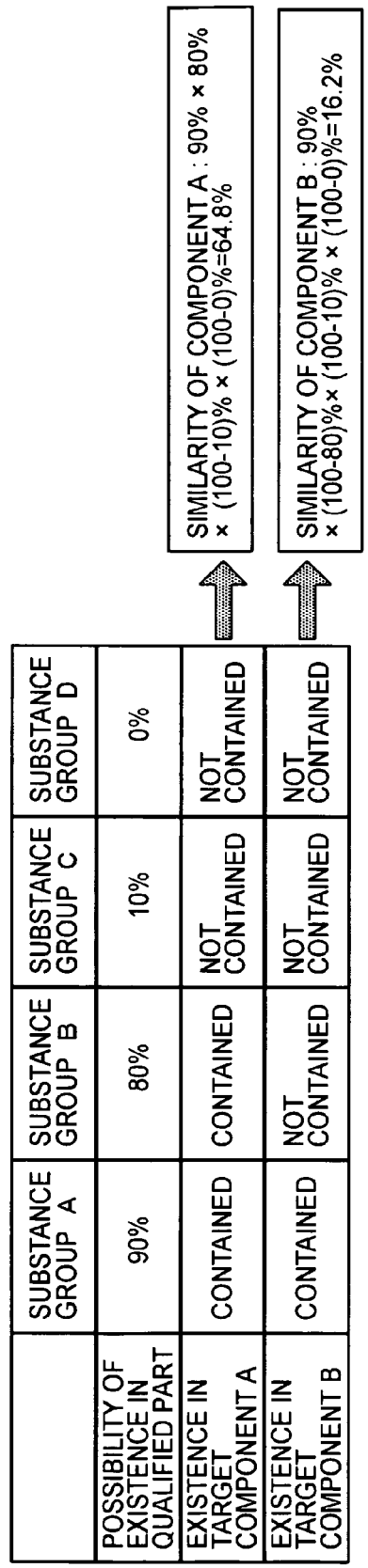
FIG. 13 is an explanatory view showing an exemplary screen on which the similarity is displayed and exemplary calculations according to the embodiment.

Taking the case shown in FIG. 13 as an example, the similarity is 64.8% for a component A and is 16.2% for a component B. The effect of this means is as follows. Even if data is not provided by the supplier or the amount of data provided by the supplier is small, the possibility that the target component is qualified is estimated based on the qualification information of the similar component. As a result, the designer can avoid the risk of inconformity to environmental regulations at the early stage of design.

(6) Calculation of Recommendation Ranking

Means which calculates recommendation ranking of the target component and the similar components based on the pass rate of the constituent information of the target component, a registration rate of the component information provided by the supplier, and the similarity of the component provided by the supplier to the qualified component to support the designer's selection of a component will be described with reference to FIG. 15. Although the similarity denotes that obtained by the process shown in FIG. 12, any value representing the possibility that the component is qualified such as the credibility obtained in FIG. 10 may be used.

The system 100 in this embodiment searches for components similar to the target component in a step 1401. The system 100 refers to a component basic information table 1410 to search for similar components at each supplier (step 1402). Then, the system 100 obtains a pass rate at each supplier in a step 1403 and obtains a registration rate in a step 1404 and obtains a multiple of the pass rate and the registration rate as a trust of each supplier (step 1405). An example of calculation of the trust of a supplier A is shown in FIG. 15.

Furthermore, the system 100 calculates the number of qualifying establishments, a pass rate, and a similarity for each component (steps 1406 to 1408). The number of qualifying establishments is the number of establishments which have qualified the component, and the pass rate is a pass rate on the results of qualification (passing statuses such as pass or fail; a status that is not "not investigated"). An example of the calculation of the number of qualifying establishments and the pass rate is shown in FIG. 8. The similarity is obtained by the above-described method shown in FIG. 12.

In a step 1409, recommendation ranking is determined for the target component and the similar components. An example of the method which calculates the recommendation ranking will be described below. The number of qualifying establishments, a pass rate, a credibility, and a trust are provided for each component. In determining the recommendation ranking, the first priority is given to the components with a larger number of qualifying establishments. If the recommendation ranking cannot be determined based on the number of qualifying establishments, the recommendation ranking is determined based on the pass rate, then, based on the credibility, and finally based on the trust. An example of the calculation is shown in FIG. 16.

The effect of this means is that the recommendation ranking is determined for the components to facilitate the designer's selection of a component.

(7) Output

The constituent information credibility evaluation system 100 outputs the result of evaluation of the conformity/credibility of the target component obtained by the processing in the step 104 through the input/output device 1704. According to this embodiment, the designer can use the result of output as a reference value for selecting a component.

Next, the system 100 accepts the input of the content of confirmation of the result of evaluation by the designer (step 105). In accordance with the content of confirmation, the system 100 requests for re-investigation of the target component (step 106), determines not to adopt the target component and makes a new search (step 114), or determines to adopt the target component and transmits a component qualification request (step 107).

What is claimed is:

1. A system for evaluating reliability of a component, where said system evaluates credibility of a constituent information and a conformity of a candidate component to environmental regulations, for composing a product, comprising:
   an input unit;
   an output unit;
   a processing unit; and
   a memory unit,
   wherein the memory unit comprises:
   a component basic information table which retains identification information that distinguishes each item of a component;
   a constituent information table which retains information on constituents contained in the component and a content of each of the constituents; and
   an environmental qualification information table which retains information on constituents contained in the component for each item and a investigation result of conformity of the component to environmental regulations by establishments, and
   wherein the processing unit comprises:
   means which accepts selection of a target component through the input unit;
   means which accepts identification information that classifies components similar to the target component through the input unit;
   means which extracts a component similar to the target component based on the identification information of classified components similar to the target component by referring to the component basic information table and the constituent information table, and calculates constituents contained in the similar component and a content of each of the constituents;
   means which calculates each of the constituents contained in the target component and the content of each constituent, based on the content of each constituent of the component similar to the target component, which is obtained from the constituent information table, the content of each constituent being weighted based on a number of establishments that investigated the similar component, which is obtained from the environmental qualification information table;
   means which evaluates credibility of the evaluation of the conformity to environmental regulations based on a difference between the content of the constituent in the target component and the content of the constituent in the similar component, the constituent being used for the evaluation of the conformity to environmental regulations among the constituents contained in the target-component; and
   means which evaluates a conformity of the target component to environmental regulations by using the number of establishments that have already investigated the similar components and a total number of the similar components with a result of a qualification "pass ", which are obtained from the environmental qualification information table;
   wherein the output unit outputs the result of the conformity/credibility evaluation.

2. A system according to claim 1, wherein the processing unit comprises:
   means which accepts selection of a status of the target component through the input unit;
   means which makes a re-investigation request attached with the result of investigation of the target component to a manufacturer of the component when the re-investigation is selected as the status;
   means which makes a qualification request to a component final confirmation personnel when adoption is selected as the status; and
   means which returns to the input unit of basic information of the target component when non-adoption is selected as the status.

3. A system according to claim 1, wherein the component similar to the target component is extracted referring to the component basic information table by searching for the similar component based on the identification information of the target component according to a definition of the similar component.

4. A method for evaluating reliability on component, which evaluates credibility of an evaluation result of conformity of a component to environmental regulations, comprising the steps of:
   calculating constituents contained in a target component and a content of each of the constituents referring to a constituent information table based on identification information of the target component and evaluating conformity of the constituent to environmental regulations based on the content;
   extracting a component similar to the target component referring to an environmental qualification information table and calculating constituents contained in the similar component and a content of each of the constituents; and
   evaluating credibility of evaluation of the conformity to environmental regulations based on a difference between the content of the constituent in the target component and the content of the constituent in the similar component, the constituent being used for the evaluation of the conformity to environmental regulations among the constituents contained in the target component.

* * * * *